United States Patent [19]
Sato et al.

[11] Patent Number: 5,985,525
[45] Date of Patent: Nov. 16, 1999

[54] DEVELOPER SOLUTION FOR PHOTORESIST COMPOSITION

[75] Inventors: Mitsuru Sato, Zama; Hatsuyuki Tanaka; Toshimasa Nakayama, both of Chigasaki, all of Japan

[73] Assignee: Tokyo Ohta Kogyo Co., Ltd., Japan

[21] Appl. No.: 08/127,640

[22] Filed: Sep. 28, 1993

[30] Foreign Application Priority Data

Oct. 1, 1992 [JP] Japan .................................. 4-284929

[51] Int. Cl.$^6$ ....................................................... G03C 5/00
[52] U.S. Cl. ............................................................ 430/331
[58] Field of Search ............................................. 430/331

[56] References Cited

U.S. PATENT DOCUMENTS

| | | | |
|---|---|---|---|
| 3,607,271 | 9/1971 | Helden et al. | 430/331 |
| 3,954,472 | 5/1976 | Walls | 430/331 |
| 4,294,911 | 10/1981 | Guild | 430/331 |
| 4,308,340 | 12/1981 | Walls | 430/331 |
| 4,381,340 | 4/1983 | Walls | 430/331 |
| 4,610,953 | 9/1986 | Hashimoto et al. | 430/331 |
| 4,820,621 | 4/1989 | Tanka et al. | 430/331 |
| 4,914,006 | 4/1990 | Kato et al. | 430/331 |

FOREIGN PATENT DOCUMENTS

| | | |
|---|---|---|
| 60-225152 | 11/1985 | Japan . |
| 62-35351 | 2/1987 | Japan . |
| 4-204454 | 11/1990 | Japan . |
| 4204454 | 7/1992 | Japan . |

*Primary Examiner*—Maria Nuzzolillo
*Assistant Examiner*—L. Weiner

[57] ABSTRACT

Proposed is an aqueous developer solution for an alkali-developable photoresist composition which contains, besides a water-soluble organic basic compound such as tetramethyl ammonium hydroxide and an anionic or non-ionic surface active agent as conventional ingredients in the prior art developwer solutions, an inorganic ammonium salt such as ammonium sulfate, ammonium phosphates and ammonium borates in a limited amount. By virtue of this unique additive, the developer solution is advantageous in respect of the absence of any scums on the patterned resist layer obtained by the development treatment therewith as well as quite good orthogonality in the cross sectional profile of line-patterned resist layer in addition to the greatly improved latitude in the light exposure dose and range of focusing depth in the light-exposure process of the resist layer with ultraviolet light.

9 Claims, No Drawings

DEVELOPER SOLUTION FOR PHOTORESIST COMPOSITION

BACKGROUND OF THE INVENTION

The present invention relates to a developer solution for a photoresist composition or, more particularly, to a developer solution for alkali-developable positive- and negative-working photoresist compositions widely used in the photolithographic precision-patterning works in the manufacture of various kinds of semiconductor devices.

As is well known, it is a well established technology in the electronics industry that a finely patterned resist layer is formed by the photolithographic method on the surface of a substrate such as semiconductor silicon wafers in the manufacturing process of various kinds of semiconductor devices such as ICs, LSIs and the like. In the photolithographic patterning process, a layer of a photosensitive composition formed on the substrate surface is exposed patternwise to actinic rays such as ultraviolet light to form a patterned latent image which is then developed to give a patterned resist layer by using a suitable developer solution which is a weakly alkaline aqueous solution when the photosensitive composition is an alkali-developable photosensitive resin composition. It is usual that the alkaline developer solution contains an organic base free from any metallic element such as tetramethyl ammonium hydroxide, choline and the like in consideration of the possible adverse influences caused on the performance of the semiconductor devices by the metallic contaminant coming from the developer solution.

Among the various requirements which a developer solution for a photoresist composition should satisfy, it is very important that the substrate surface bearing the patterned resist layer after development is absolutely free from scums produced in the development treatment since even a slightest deposition of scums on the patterned resist layer would have a very serious adverse influence on the quality of the semiconductor device manufactured by subsequent processing.

Various attempts and proposals have been made heretofore in order to minimize occurrence of scums on the patterned resist layer after development by modifying the nature of the developer solution with the admixture of a specific additive. An additive agent of the most widely used class in this regard is a surface active agent including anionic surface active agents such as alkyl-substituted diphenyl ether ammonium sulfonates disclosed in Japanese Patent Kokai No. 4-204454 and non-ionic surface active agents such as polyoxyethyleneglycol mono(alkylphenyl) ethers disclosed in Japanese Patent Kokai No. 63-25650.

Even if not to mention that occurrence of scums cannot be completely prevented by using a developer solution admixed with these surface active agents, another problem in the use of a surface active agent in the developer solution is that, while it is highly desirable that the cross sectional profile of the line pattern of the resist layer formed by the development treatment is orthogonally upright on the substrate surface with square shoulders, the shoulder portion of the line pattern of the resist layer formed by using such a developer solution is sometimes rounded.

Besides the above mentioned problems relative to the performance of the developer solutions, it is a trend in the photolithographic technology in recent years that improvement in the reproducibility and productivity of the patterning works is desired by using materials which ensure a larger latitude of light exposure dose and wider depth of focus than in the use of conventional materials. These parameters naturally depend on the performance not only of the photosensitive resin composition but also of the developer solution so that, along with the improving efforts of the photosensitive resin composition, it is eagerly desired to have a developer solution capable of giving improvements relative to these parameters. None of the developer solutions proposed heretofore, however, can be quite satisfactory in this regard.

SUMMARY OF THE INVENTION

The present invention accordingly has an object to provide a novel and improved developer solution for an alkali-developable photoresist composition which ensures absence of any scums on the patterned resist layer after development and good orthogonality of the cross sectional profile of a line pattern and with which the photolithographic patterning work can be performed with a greatly improved latitude of light exposure dose and depth of focus.

Thus, the developer solution of the present invention for an alkali-developable photoresist composition comprises, as a uniform solution:

(a) water as the solvent;
(b) a water-soluble organic basic compound;
(c) a surface active agent; and
(d) an inorganic ammonium salt selected from the group consisting of ammonium sulfate, ammonium phosphates and ammonium borates in an amount, for example, in the range from 0.01 to 0.20% by weight based on the total amount of the components (a), (b) and (c).

DETAILED DESCRIPTION OF THE PREFERRED EMBODIMENTS

As is defined above, the essential ingredients in the inventive developer solution are the components (a), (b), (c) and (d), of which the component (a) is water to serve as the solvent for the other ingredients and the other components are each a solute dissolved therein.

The component (b) is a water-soluble organic basic compound which must be free from any metallic elements. Various kinds of organic basic compounds used in conventional developer solutions can be used here without particular limitations. Examples of suitable organic basic compounds include primary, secondary and tertiary aryl and alkyl amines, of which the substituent hydrocarbon groups can be straightly linear, branched or cyclic, such as alkylene diamines, e.g., 1,3-diaminopropane, aryl amines, e.g., 4,4'-diaminodiphenyl amine, bis(dialkylamino)imine and the like, organic bases having a heterocyclic structure consisting of 3 to 5 carbon atoms and one or two hetero atoms selected from nitrogen, oxygen and sulfur such as pyrrole, pyrrolidine, pyrrolidone, pyridine, morpholine, pyrazine, piperidine, oxazole and thiazole and lower alkyl quaternary ammonium hydroxides such as tetramethyl ammonium hydroxide and trimethyl(2-hydroxyethyl) ammonium hydroxide, i.e. choline, of which particularly preferred are the last mentioned tetramethyl ammonium hydroxide and choline. These organic basic compounds can be used either singly or as a combination of two kinds or more according to need. The concentration of the water-soluble organic basic compound in the inventive developer solution is usually in the range from 1 to 10% by weight.

The component (c) is a surface active agent which can be anionic or non-ionic and can be selected from those surface active agents conventionally used in developer solutions without particular limitations. Examples of suitable anionic surface active agents include those diphenyl ether derivatives represented by the general formula

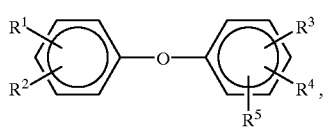 (I)

in which $R^1$ is an alkyl or alkoxy group having 5 to 18 carbon atoms, $R^2$ is a hydrogen atom or an alkyl or alkoxy group having 5 to 18 carbon atoms, $R^3$ is an unsubstituted or substituted ammonium sulfonate group of the formula —$SO_3NR_4$, each R being, independently from the others, a hydrogen atom, alkyl group of 1 to 3 carbon atoms or hydroxyalkyl group of 1 or 2 carbon atoms, and $R^4$ and $R^5$ are, each independently from the other, a hydrogen atom or an unsubstituted or substituted ammonium sulfonate group defined above.

Examples of suitable anionic surface active agents represented by the above given general formula (I) include, as is disclosed in Japanese Patent Kokai No. 4-204454, alkyl diphenyl ether ammonium sulfonates, alkyl diphenyl ether tetramethyl ammonium sulfonates, alkyl diphenyl ether trimethyl 2-hydroxyethyl ammonium sulfonates, alkyl diphenyl ether triethyl ammonium sulfonates, alkyl diphenyl ether di(ammonium sulfonates), alkyl diphenyl ether bis[di(2-hydroxyethyl) ammonium sulfonates], alkyl diphenyl ether bis(tetramethyl ammonium sulfonates) and the like.

Examples of the diphenyl ether compound suitable as the anionic surface active agent include: ammonium 4-pentyl diphenyl ether-4'-sukfonate; tetramethyl ammonium 4-heptyl diphenyl ether-4'-sulfonate; trimethyl 2-hydroxyethyl ammonium 4-pentyl diphenyl ether-4'-sulfonate; triethyl ammonium 4-pentyl diphenyl ether-4'-sulfonate; ammonium 4-dodecyl diphenyl ether-4'-sulfonate; diammonium 4-dodecyl diphenyl ether-2',4'-disulfonate; bis(di-2-hydroxyethyl ammonium) 4-dodecyl diphenyl ether-2',4'-disulfonate; bis(tetramethyl ammonium) 4-dodecyl diphenyl ether-2',4'-disulfonate; ammonium 4-pentadecyl diphenyl ether-4'-sulfonate; ammonium 2,4-dinonyl diphenyl ether-4'-sulfonate; ammonium 4-octyl diphenyl ether-4'-sulfonate; tetramethyl ammonium 4-pentadecyl diphenyl ether-4'-sulfonate and ammonium 4-pentoxy diphenyl ether-4'-sulfonate. Among the above named diphenyl ether compounds, the disulfonate compounds, in which the group denoted by $R^1$ is an alkyl group and the group denoted by $R^2$ is a hydrogen atom are preferred. Those diphenyl ether compounds, of which each of $R^3$ and $R^4$ is a group of the formula —$SO_3NH_4$, are more preferable. These anionic surface active agents can be used either singly or as a combination of two kinds or more according to need.

Examples of suitable non-ionic surface active agents include polyoxyethyleneglycol alkylphenyl ethers represented by the general formula

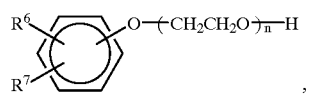 (II)

in which $R^6$ is an alkyl group having 5 to 15 carbon atoms, $R^7$ is a hydrogen atom or an alkyl group having 1 to 15 carbon atoms and the subscript n is a positive integer in the range from 5 to 60, and polyoxyethyleneglycol alkylnaphthyl ethers represented by the general formula

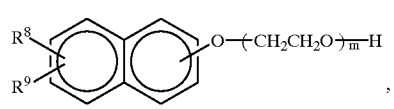 (III)

in which $R^8$ and $R^9$ are, each independently from the other, a hydrogen atom or an alkyl group having 1 to 15 carbon atoms and the subscript m is a positive integer in the range from 5 to 60.

The above defined non-ionic surface active agents are exemplified, in particular, by polyoxyethylene(16)glycol mono(dinonylphenyl) ether, polyoxyethylene(20)glycol mono(nonylphenyl) ether, polyoxyethylene(40)glycol mono (nonylphenyl) ether, polyoxyethylene(20)glycol mono (dodecylphenyl) ether, polyoxyethylene(10)glycol mono (pentylnaphthyl) ether and the like though not particularly limitative thereto as is disclosed in U.S. Pat. No. 4,820,621. These non-ionic surface active agents can be used either singly or as a combination of two kinds or more according to need.

The concentration of the surface active agent in the inventive developer solution is, usually, in the range from 0.005 to 5% by weight or, preferably, in the range from 0.01 to 1.0% by weight based on the total amount of the components (a) and (b). When the surface active agent is selected from the above defined anionic and non-ionic surface active agents and used in the above mentioned concentration, good results can be obtained in the removal of scums on the patterned resist layer and in the orthogonality of the cross sectional profile of line patterns.

The most characteristic ingredient in the inventive developer solution is the component (d) which is a specific inorganic ammonium salt selected from the group consisting of ammonium sulfate, ammonium phosphates and ammonium borates. Suitable ammonium phosphates include triammonium phosphate, diammonium monohydrogen phosphate and monoammonium dihydrogen phosphate, of which monoammonium dihydrogen phosphate and diammonium hydrogen phosphate are preferred. Suitable ammonium borates include ammonium metaborate $(NH_4)_2O.B_2O_3$, ammonium tetraborate $(NH_4)_2O.2B_2O_3$ and ammonium pentaborate $(NH_4)_2O.5B_2O_3$, of which ammonium pentaborate is preferred. Most preferable, however, is ammonium sulfate among the above named three groups of the ammonium salts in respect of good availability of high-purity salt and inexpensiveness.

The amount of the inorganic ammonium salt as the component (d) is, usually, in the range from 0.01 to 0.20% by weight or, preferably, in the range from 0.02 to 0.10% by weight based on the total amount of the components (a), (b) and (c). When the amount of the ammonium salt in the developer solution is too large or too small, full improvement can hardly be obtained in the orthogonality of the cross sectional profile of line patterns as well as in the latitude of light exposure dose and depth of focus.

It should be mentioned that a prior art is known in which an inorganic ammonium salt is added to a developer solution for a positive-working photoresist composition. For example, Japanese Patent Kokai No. 56-1935 discloses addition of various kinds of inorganic sulfites including ammonium sulfite to a developer solution. The object thereof, however, consists in the improvement of storability of the developer solution against oxidation due to the atmospheric oxygen by utilizing the reducing power of sulfites. It is therefore not surprising that the amount of the ammonium sulfite added to the developer solution is quite large in order to exhibit the effect of anti-oxidation. According to the examples of the prior art, the concentration of ammonium sulfite must be 5.0% or larger so that it is quite surprising that a great improvement as described below can be obtained by the addition of a very small amount of the specific inorganic ammonium salt mentioned above although the mechanism therefor is not well understood.

It is of course optional that the inventive developer solution comprising the above described essential components is further admixed with various kinds of known additives including moisturizing agents, stabilizers, solubilizers and the like each in a limited amount.

In the following, formulations of the inventive developer solution and the performance thereof are described in more detail by way of examples, which, however, never limit the scope of the invention in any way. In the following Examples and Comparative Examples, the developer solutions were evaluated relative to (1) the deposition of scums on the patterned resist layer, (2) cross sectional profile of the line patterns, (3) latitude of the light exposure dose and (4) depth of focus each by the procedure given below.

(1) deposition of scums

The patterned resist layer was examined by using an electron microscope and the results were recorded as "found" or "no" when scums were found or not found, respectively.

(2) Cross sectional profile of line patterns

The results of observation with an electron microscope were recorded as "poor" or "good" when the shoulder portion of the cross sectional profile was rounded or square, respectively.

(3) Latitude of light exposure dose

Resist patterns were formed by varying the light exposure time and the width of the patterned lines was measured by using a measurement scanning electron microscope to determine the relationship between the exposure time and the width of the patterned line. The results were recorded in terms of the range of the exposure time in mseconds by which a line width of 0.6 μm (±10%) could be obtained.

(4) Depth of focus

Exposure of the resist layer to ultraviolet light was performed on a minifying light-projection exposure machine with a focusing point displaced little by little and the patterned resist layer after development was examined using a scanning electron microscope to determine the range of the focusing depth by which a line pattern of 0.6 μm width with orthogonality of the cross sectional profile could be obtained.

EXAMPLE 1

An aqueous developer solution was prepared by the admixture of a 2.50% by weight aqueous solution of tetramethyl ammonium hydroxide with 0.2% by weight of an anionic surface active agent 4'-dodecyl diphenyl ether di(ammonium sulfonate) and 0.03% by weight of ammonium sulfate.

Separately, a 6-inch semiconductor silicon wafer was coated on a spinner with a commercial product of a positive-working photoresist composition (TSMR-8800, a product by Tokyo Ohka Kogyo Co.) containing an alkali-soluble novolac resin and a naphthoquinone diazide compound as the photosensitizing agent in a coating thickness of 1.0 μm as dried followed by a pre-baking treatment on a hot plate at 90° C. for 90 seconds. The thus formed photoresist layer was subjected to patternwise exposure to ultraviolet light through a test chart mask on a minifying light-projection exposure machine (Model NSR-1505G7E, manufactured by Nikon Co.) and then to a post-exposure baking treatment at 110° C. for 90 seconds followed by a development treatment in a static-paddle development machine by using the above prepared developer solution at 23° C. for 65 seconds and rinsing in a running stream of deionized water to give a patterned resist layer which was evaluated for the items described above. The results of the evaluation tests were as follows: no scum deposition; good cross sectional profile; 40 mseconds of the latitude of exposure time; and 1.8 μm of the range of focusing depth.

EXAMPLE 2

The experimental procedure was just the same as in Example 1 except that the surface active agent was polyoxyethylene(16)glycol mono(dinonylphenyl) ether. The results of the evaluation tests were as follows: no scum deposition; good cross sectional profile; 36 mseconds of the latitude of exposure time; and 1.8 μm of the range of focusing depth.

EXAMPLE 3

The experimental procedure was just the same as in Example 1 except that the surface active agent was polyoxyethylene(10)glycol mono(pentylnaphthyl) ether. The results of the evaluation tests were as follows: no scum deposition; good cross sectional profile; 38 mseconds of the latitude of exposure time; and 1.8 μm of the range of focusing depth.

EXAMPLE 4

The experimental procedure was just the same as in Example 1 except that the surface active agent was 4'-dodecyl diphenyl ether bis[di(2-hydroxyethyl ammonium) sulfonate] and the amount of ammonium sulfate was increased to 0.05% by weight. The results of the evaluation tests were as follows: no scum deposition; good cross sectional profile; 37 mseconds of the latitude of exposure time; and 1.8 μm of the range of focusing depth.

EXAMPLE 5

The experimental procedure was just the same as in Example 1 except that the surface active agent was 4'-dodecyl diphenyl ether bis(tetramethyl ammonium sulfonate) and the amount of the surface active agent was decreased to 0.15% by weight. The results of the evaluation tests were as follows: no scum deposition; good cross sectional profile; 40 mseconds of the latitude of exposure time; and 1.8 μm of the range of focusing depth.

EXAMPLE 6

The experimental procedure was just the same as in Example 1 except that the surface active agent was 4'-dodecyl diphenyl ether 4-(ammonium sulfonate), the amount of the surface active agent was decreased to 0.15% by weight and the amount of ammonium sulfate was increased to 0.04% by weight. The results of the evaluation tests were as follows: no scum deposition; good cross sectional profile; 36 mseconds of the latitude of exposure time; and 1.8 μm of the range of focusing depth.

EXAMPLE 7

The experimental procedure was just the same as in Example 1 except that the surface active agent was polyoxyethylene(20)glycol mono(nonylphenyl) ether, the amount of the surface active agent was decreased to 0.18% by weight and the amount of ammonium sulfate was increased to 0.05% by weight. The results of the evaluation tests were as follows: no scum deposition; good cross sectional profile; 37 mseconds of the latitude of exposure time; and 1.8 μm of the range of focusing depth.

EXAMPLE 8

The experimental procedure was just the same as in Example 1 except that the surface active agent was polyoxyethylene(40)glycol mono(nonylphenyl) ether, the amount of the surface active agent was decreased to 0.18% by weight and the amount of ammonium sulfate was increased to 0.06% by weight. The results of the evaluation tests were as follows: no scum deposition; good cross sectional profile; 38 mseconds of the latitude of exposure time; and 1.8 μm of the range of focusing depth.

EXAMPLE 9

The experimental procedure was just the same as in Example 1 except that the surface active agent was polyoxyethylene(20)glycol mono(dodecylphenyl) ether and the amount of ammonium sulfate was increased to 0.04% by weight. The results of the evaluation tests were as follows: no scum deposition; good cross sectional profile; 38 mseconds of the latitude of exposure time; and 1.8 μm of the range of focusing depth.

Comparative Example 1

The experimental procedure was just the same as in Example 1 except that the surface active agent was omitted in the formulation of the developer solution. The results of the evaluation tests were as follows: scum deposition found; good cross sectional profile; 36 mseconds of the latitude of exposure time; and 1.8 μm of the range of focusing depth.

Comparative Example 2

The experimental procedure was just the same as in Example 1 except that ammonium sulfate was omitted in the formulation of the developer solution. The results of the evaluation tests were as follows: no scum deposition; poor cross sectional profile; 28 mseconds of the latitude of exposure time; and 1.6 μm of the range of focusing depth.

Comparative Example 3

The experimental procedure was just the same as in Example 1 except that the surface active agent was polyoxyethylene(16)glycol mono(dinonylphenyl) ether and ammonium sulfate was omitted in the formulation of the developer solution. The results of the evaluation tests were as follows: no scum deposition; poor cross sectional profile; 26 mseconds of the latitude of exposure time; and 1.6 μm of the range of focusing depth.

EXAMPLE 10

The experimental procedure was just the same as in Example 1 except that ammonium sulfate was replaced with the same amount of monoammonium dihydrogen phosphate in the formulation of the developer solution. The results of the evaluation tests were as follows: no scum deposition; good cross sectional profile; 40 mseconds of the latitude of exposure time; and 1.8 μm of the range of focusing depth.

EXAMPLE 11

The experimental procedure was just the same as in Example 1 except that the surface active agent was polyoxyethylene(16)glycol mono(dinonylphenyl) ether and ammonium sulfate was replaced with the same amount of monoammonium dihydrogen phosphate in the formulation of the developer solution. The results of the evaluation tests were as follows: no scum deposition; good cross sectional profile; 36 mseconds of the latitude of exposure time; and 1.8 μm of the range of focusing depth.

EXAMPLE 12

The experimental procedure was just the same as in Example 1 except that the surface active agent was polyoxyethylene(10)glycol mono(pentylnaphthyl) ether and ammonium sulfate was replaced with the same amount of monoammonium dihydrogen phosphate in the formulation of the developer solution. The results of the evaluation tests were as follows: no scum deposition; good cross sectional profile; 38 mseconds of the latitude of exposure time; and 1.8 μm of the range of focusing depth.

EXAMPLE 13

The experimental procedure was just the same as in Example 1 except that ammonium sulfate was replaced with the same amount of ammonium pentaborate in the formulation of the developer solution. The results of the evaluation tests were as follows: no scum deposition; good cross sectional profile; 37 mseconds of the latitude of exposure time; and 1.8 μm of the range of focusing depth.

EXAMPLE 14

The experimental procedure was just the same as in Example 1 except that the surface active agent was polyoxyethylene(16)glycol mono(dinonylphenyl) ether and ammonium sulfate was replaced with the same amount of ammonium pentaborate in the formulation of the developer solution. The results of the evaluation tests were as follows: no scum deposition; good cross sectional profile; 40 mseconds of the latitude of exposure time; and 1.8 μm of the range of focusing depth.

EXAMPLE 15

The experimental procedure was just the same as in Example 1 except that the surface active agent was polyoxyethylene(10)glycol mono(pentylnaphthyl) ether and ammonium sulfate was replaced with the same amount of ammonium pentaborate in the formulation of the developer solution. The results of the evaluation tests were as follows: no scum deposition; good cross sectional profile; 36 mseconds of the latitude of exposure time; and 1.8 μm of the range of focusing depth.

EXAMPLE 16

The experimental procedure was just the same as in Example 1 except that the amount of the surface active agent was increased from 0.2% to 0.5% by weight and the amount of ammonium sulfate was increased from 0.03% to 0.08% by weight in the formulation of the developer solution. The results of the evaluation tests were as follows: no scum deposition; good cross sectional profile; 40 mseconds of the latitude of exposure time; and 1.8 μm of the range of focusing depth.

EXAMPLE 17

A negative-working photoresist composition containing a poly(hydroxystyrene), an alkoxyamino resin and a triazine compound as the principal ingredients (THMR-iN200, a product by Tokyo Ohka Kogyo Co.) was applied to the surface of a 6-inch silicon wafer by using a spinner and pre-baked on a hot plate at 110° C. for 90 seconds to form a photoresist layer having a thickness of 1.5 μm which was exposed patternwise to ultraviolet light through a test chart photomask on a minifying light-projection exposure machine (Model 1755i7B, manufactured by Nikon Co.). The development treatment of this patternwise exposed resist layer was conducted, after a post-exposure baking treatment at 100° C. for 90 seconds, by using the same developer solution as used in Example 1 at 23° C. for 65 seconds in a static-paddle development machine followed by rinsing with deionized water and drying to give a patterned resist layer.

The results of the evaluation tests of this patterned resist layer were as follows: no scum deposition; good cross sectional profile; 98 mseconds of the latitude of exposure time; and 1.0 μm of the range of focusing depth.

EXAMPLE 18

The experimental procedure was just the same as in Example 17 except that the surface active agent was replaced with the same amount of polyoxyethylene(16) glycol mono(dinonylphenyl) ether in the formulation of the developer solution. The results of the evaluation tests were as follows: no scum deposition; good cross sectional profile; 90 mseconds of the latitude of exposure time; and 1.0 μm of the range of focusing depth.

What is claimed is:

1. An aqueous developer solution for an alkali-developable photoresist composition which comprises, as a uniform solution:

(a) water as the solvent;
   (b) a water-soluble organic basic compound;
   (c) a surface active agent; and
   (d) an inorganic ammonium salt selected from the group consisting of ammonium sulfate, ammonium phosphates and ammonium borates in an amount in the range from 0.01 to 0.20% by weight based on the total amount of the components (a), (b) and (c).

2. The aqueous developer solution for an alkali-developable photoresist composition as claimed in claim 1 in which the inorganic ammonium salt is ammonium sulfate.

3. The aqueous developer solution for an alkali-developable photoresist composition as claimed in claim 1 in which the water-soluble organic basic compound is tetramethyl ammonium hydroxide or trimethyl 2-hydroxyethyl ammonium hydroxide.

4. The aqueous developer solution for an alkali-developable photoresist composition as claimed in claim 1 in which the surface active agent is an anionic surface active agent or a non-ionic surface active agent.

5. The aqueous developer solution for an alkali-developable photoresist composition as claimed in claim 4 in which the surface active agent is an anionic surface active agent selected from the group consisting of the diphenyl ether derivatives represented by the general formula

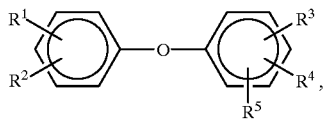

in which $R^1$ is an alkyl or alkoxy group having 5 to 18 carbon atoms, $R^2$ is a hydrogen atom or an alkyl or alkoxy group having 5 to 18 carbon atoms, $R^3$ is an unsubstituted or substituted ammonium sulfonate group of the formula $-SO_3NR_4$, each R being, independently from the others, a hydrogen atom, alkyl group having 1 to 3 carbon atoms or hydroxyalkyl group having 1 or 2 carbon atoms, and $R^4$ and $R^5$ are, each independently from the other, a hydrogen atom or an unsubstituted or substituted ammonium sulfonate group defined above.

6. The aqueous developer solution for an alkali-developable photoresist composition as claimed in claim 4 in which the surface active agent is a non-ionic surface active agent selected from the group consisting of the polyoxyethyleneglycol alkylphenyl ethers represented by the general formula

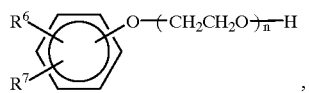

in which $R^6$ is an alkyl group having 5 to 15 carbon atoms, $R^7$ is a hydrogen atom or an alkyl group having 1 to 15 carbon atoms and the subscript n is a positive integer in the range from 5 to 60, and polyoxyethyleneglycol alkylnaphthyl ethers represented by the general formula

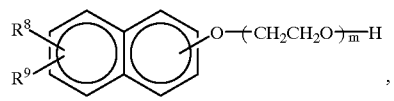

in which $R^8$ and $R^9$ are, each independently from the other, a hydrogen atom or an alkyl group having 1 to 15 carbon atoms and the subscript m is a positive integer in the range from 5 to 60.

7. The aqueous developer solution for an alkali-developable photoresist composition as claimed in claim 1 in which the amount of the inorganic ammonium salt as the component (d) is in the range from 0.02 to 0.10% by weight based on the total amount of the components (a), (b) and (c).

8. The aqueous developer solution for an alkali-developable photoresist composition as claimed in claim 5 in which the anionic surface active agent is 4'-dodecyl diphenyl ether di(ammonium sulfonate) or 4'-dodecyl diphenyl ether bis(tetramethyl ammonium sulfonate).

9. The aqueous developer solution for an alkali-developable photoresist composition as claimed in claim 6 in which the non-ionic surface active agent is polyoxyethylene(16)glycol mono(dinonylphenyl) ether or polyoxyethylene(10)glycol mono(pentylnaphthyl) ether.

* * * * *